United States Patent [19]

Witten et al.

[11] 4,433,881
[45] Feb. 28, 1984

[54] CONNECTING MECHANISM FOR WORD PROCESSOR - CONTROLLED PRINTER OUTPUT MODULE CABINETS

[75] Inventors: Franklyn H. Witten; Sherman S. Kline, both of San Antonio, Tex.

[73] Assignee: Datapoint Corporation, San Antonio, Tex.

[21] Appl. No.: 321,807

[22] Filed: Nov. 16, 1981

[51] Int. Cl.³ .............................................. A47B 81/00
[52] U.S. Cl. ................................. 312/107.5; 312/107; 312/111; 312/198; 312/222
[58] Field of Search .......................... 211/41, 126, 189; 312/215, 222, 107, 107.5, 198, 199, 111, 200

[56] References Cited

U.S. PATENT DOCUMENTS

| | | | |
|---|---|---|---|
| 1,937,978 | 12/1933 | Miller | 292/127 |
| 3,327,657 | 6/1967 | Hauville | 211/189 X |
| 3,339,956 | 9/1967 | Bencene et al. | 292/127 |
| 3,517,977 | 6/1970 | Wenger | 312/111 |
| 3,539,213 | 11/1970 | Attaway | 292/127 |
| 3,567,268 | 3/1971 | Ambaum et al. | 312/198 X |
| 3,955,681 | 5/1976 | DeZinno | 211/126 X |
| 4,087,142 | 5/1978 | Aumack | 312/198 X |
| 4,337,988 | 3/1980 | Schenck | 312/278 X |

FOREIGN PATENT DOCUMENTS 48195 12/1933 Denmark ........................... 312/107

Primary Examiner—William E. Lyddane
Assistant Examiner—Joseph Falk
Attorney, Agent, or Firm—McCamish, Ingram, Martin & Brown

[57] ABSTRACT

A connecting and alignment mechanism for printer output module cabinets having facing adjacent wall members, comprising vertical positioning male-female docking channels and lateral positioning docking pins and recepticles.

3 Claims, 3 Drawing Figures

CONNECTING MECHANISM FOR WORD PROCESSOR - CONTROLLED PRINTER OUTPUT MODULE CABINETS

INCORPORATION BY REFERENCE

Applicant(s) hereby incorporate(s) by reference the structural details and descriptions included in the following patent applications:

(1) U.S. Patent Applications:

"Word Processor—Controlled Printer Output Scanner Mechanism", Ser. No. 321,808, filed on Nov. 16, 1981, in the names of Elliot N. Tompkins and Sherman S. Kline;

"Word Processor—Controlled Printer Paper Transport", Ser. No. 322,095, filed on Nov. 16, 1981, in the name of Sherman S. Kline.

(2) Patent Cooperation Treaty Application:

"Word Processor—Output Printer Bin Lock Box", Ser. No. 347,134, filed on Nov. 16, 1981, in the International Receiving Office in the names of David R. Davis, Sherman S. Kline, Victor D. Poor and Elliot N. Tompkins.

BACKGROUND OF THE DISCLOSURE

The present invention relates to a connecting and alignment mechanism for cabinet modules, particularly cabinet modules which must be accurately aligned and connected one to the other. The invention has particular application in connecting photocopy, laser, or other printer output modules where accurate alignment of paper transport devices is necessary.

Photocopy, laser printer, and other similar devices typically consist of a main printer or photocopy machine which processes paper or other materials in a particular manner and which outputs that paper to a channel or slot located on one side of the main unit. To provide for manufacturing flexibility and yet provide products satisfying many differing customer demands, it may be desirable to manufacture a basic photocopying or laser printing machine and manufacture different output modules, for example collators, binding or stapling units, and similar devices, which mate with the basic photocopying or laser printing machine. Such modules can be aligned with the main unit in various fashions to provide a variety of functions.

The various modules, of course, must communicate one with the other and, perhaps most importantly, must provide for accurate alignment of paper transport paths between the various modules. Prior attempts to solve the problems of accurate alignment have resulted in complex systems which are expensive to manufacture and maintain, and which do not provide an alignment and locking mechanism which is accurate and easy to operate.

The connecting and alignment mechanism of the present invention provides a simple, inexpensively constructed highly accurate connecting and alignment mechanism which is easy to install, remove, and operate, obviating the problems caused by previous aligning and locking systems.

The connecting and aligning mechanism of the present invention comprises male-female docking channels mounted on the upper portion of facing wall members of adjacent output modules to provide vertical positioning and latching, and a docking pin and receptical mounted on the lower wall portion of facing adjacent wall members of output modules for providing lateral positioning. The docking channels are formed in a male-female combination, that is, male aligning members on a first channel member mate with female aligning apertures in a second channel member. A rotating latch member on the first channel member provides a locking engagement with a pin means on the second channel member. The first and second channel members are formed of identical lengths of channel material having two pairs of vertically spaced apertures, an elongated slot formed in the center thereof, and a vertically disposed pin secured across the legs of the channel member adjacent the slot. A single channel member so manufactured is used as the basis for constructing both the first and second channel members, thereby decreasing expensive tooling and other manufacturing costs. In constructing the first channel member, male aligning members or pins are secured in a first pair of the two pairs of vertically spaced apertures and a latching hook is rotatably mounted about the vertically disposed pin adjacent the elongated slot. The second channel member is used "as is", namely the second pair of vertically spaced apertures form the female aligning apertures in the second channel member, and the vertically disposed pin forms the mating pin member for the latching means. Thus, manufacture of the connecting and aligning mechanism of the present invention is rendered extraordinarily simple and economical, yet produces an extremely accurate and secure mechanism for connecting multiple modular cabinets.

In operation, a cabinet bearing a first channel member having male aligning members and the latching member is simply wheeled into position adjacent a cabinet bearing the second channel member having the female aligning apertures. The male aligning members are inserted into the female aligning apertures which provides immediate vertical positioning of the two cabinets. Coincidentally, the lateral positioning male-female members on the lower portions of the facing adjacent wall members of the modular cabinets are mated, and the cabinets are thus positioned laterally. As the male members on the first channel member are mated with the female apertures on the second channel member, the latching hook of the first channel member passes through the corresponding elongated slot formed in the second channel member and engages the vertically extending pin disposed adjacent that slot. Rotatable positioning feet located on the bottom of the cabinet provide further stable positioning.

Therefore, a principal object of the connecting and aligning mechanism of the present invention is to provide a relatively simple, inexpensively constructed but highly accurate connecting and aligning mechanism for modular cabinets which insures an aligned paper transport path, while permitting variations in floor levels to be compensated for.

A further object of the present invention is to provide a connecting and aligning mechanism which is easy to install and remove.

Other objects, features, and advantages of the invention will become evident in light of the following detailed description, viewed in conjunction with the referenced drawings, of a preferred exemplary system according to the invention. The foregoing and following description of the invention is for exemplary purposes only. The true spirit and scope of the invention is set forth in the appended claims.

DETAILED DESCRIPTION OF THE INVENTION

Figure 1:
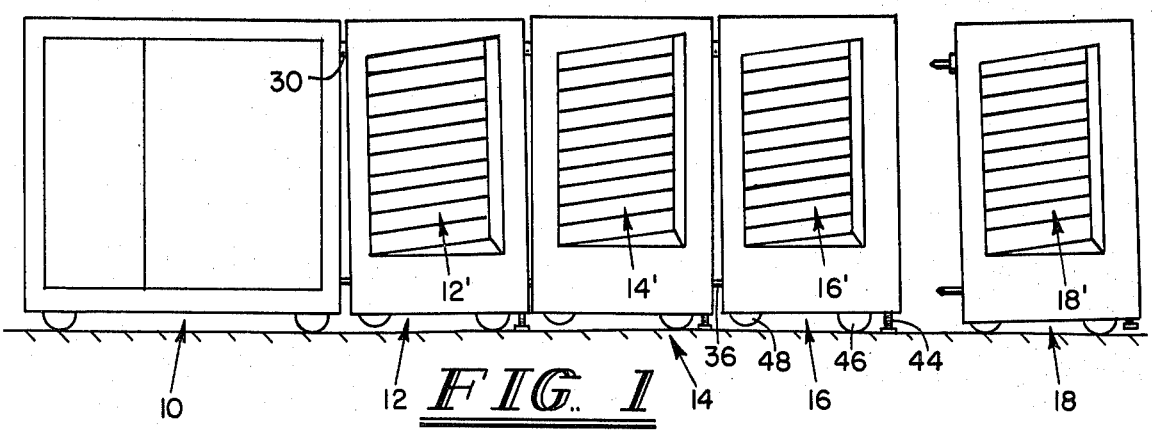
FIG. 1 is a side elevational view of an exemplary master unit with a plurality of modular cabinets connected thereto.

Referring to FIG. 1, an exemplary master unit 10, for example a laser printer, a photocopy machine or similar device, is illustrated as joined with a plurality of output module cabinets 12, 14, and 16. Output modular cabinet 18 is shown as being ready for aligning and connecting to modular cabinet 16. Modular cabinets 12, 14, 16 and 18, of course, may provide a variety of different functions, including but certainly not limited to collating, binding and stapling, and similar functions. A sheet of paper from the output (on the right of FIG.1) of the master unit 10 may be carried on a plurality of paper transport mechanisms (such as that described in U.S. patent application Ser. No. 322,095, filed on Nov. 16, 1981, and entitled "Word Processor-Controlled Printer Paper Transport") through bottom portions of the output modular cabinets 12, 14, 16 and 18 and directed under the control of a processor (not shown) to a preselected one of output bins 12', 14', 16', and 18'. As can be readily appreciated, unless the individual paper transport mechanisms—and, therefore, the successive output modular cabinets—are closely aligned in the direction perpendicular to the direction of paper movement from one output modular cabinet to the next, jams will occur, resulting in equipment down-time and possibly requiring the time and expense of service personnel.

Figure 2:
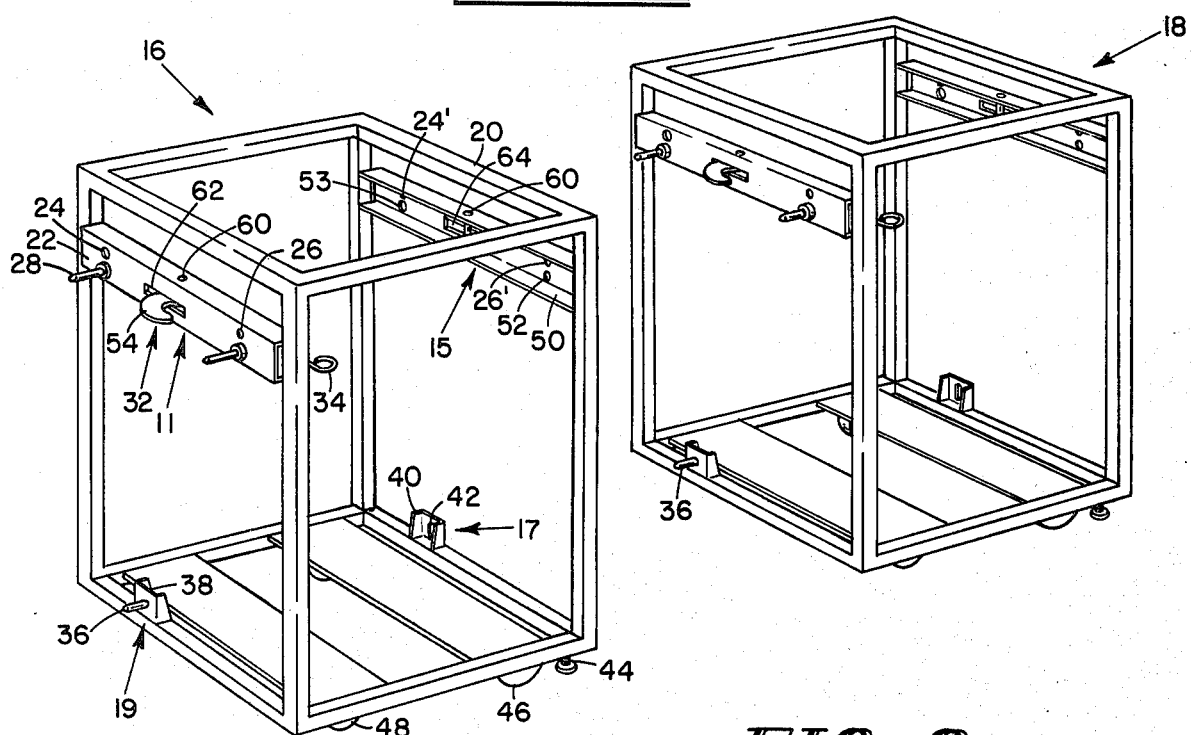
FIG. 2 is a perspective view of exemplary modular cabinet frames bearing the docking channels and lateral positioning means of the present invention.

FIG. 2 illustrates an exemplary frame 20 for exemplary output modular cabinets 16 and 18 bearing the connecting and aligning mechanism of the present invention.

Vertical positioning is accomplished by a first channel member 11 and a second channel member 15. First channel member 11, as shown in FIG. 2, is mounted on the upper portion of the wall member of cabinet 16 which will face the immediately adjacent wall member of an adjoining cabinet, for example modular cabinet 14. A first male aligning member 30 and a second male aligning member 28 are secured in apertures formed in the base of channel member 22. First and second male aligning members 30 and 28 may take the form of pins, such as shown in FIG. 2.

First docking channel member 11 has an elongated slot 62 formed in the center thereof extending along the longitudinal axis of channel member 22. The hook portion 54 of a latching means 32 extends through slot 62. As more fully described below and as more clearly illustrated in FIG. 3, latching means 32 consists of a hook shaped member 54 rotatably mounted about a pin 60 which is laterally displaced from and perpendicular to the longitudinal axis of slot 62.

Second docking channel member 15 comprises a channel member 50 having a first pair of apertures 52 and 53 and a second pair of apertures 24' and 26' vertically spaced therefrom; the two sets of apertures, namely 24', 53 and 26', 52 are disposed on both sides of elongated slot 64 formed in the center of channel on 50 and pin 60.

In manufacture, and as a principal object of this invention, it has been found extraordinarily expedient to form first and second docking channel members 11 and 15 from two identical lengths of U-shaped channel members 22 and 50. An elongated longitudinally extending slot is formed in the center of a channel member, thus forming slots 62 and 64. Two pairs of vertically spaced apertures, 52, 53 and 26', 24', are formed in the channel members on both sides of the elongated slot. A vertically disposed pin 60 is secured in the channel member 11 in a position laterally displaced from and perpendicular to the longitudinal axis of the elongated slot. A first docking channel member 11 may thus be formed by simply securing first and second male aligning members 30 and 28 to channel member 22, and rotatably mounting a latch member 32 on pin 60.

The lateral positioning means comprises a first male positioner 19 mounted on the lower portion of the wall of cabinet 16 facing the immediately adjacent cabinet. First male positioner 19 comprises a bracket 38 holding a positioning pin 36. Female positioner 17 comprises a bracket 40 having an elongated vertically extending slot 42 formed therein. Pin 36, of course, mates with slot 42.

At this point it is important to consider that many floors on which modular cabinets are used are uneven. In addition, certain manufacturing tolerances in the materials from which the cabinets are constructed must be accomodated. Therefore, it is important for aligning mechanisms to permit some relative pivotal motion between the facing adjacent wall members of the modules. In the present invention, rear aperture 53 in second docking channel member 15 is slightly over-sized or, in other words, is slightly larger than the diameter of male aligning member 28, as shown more clearly in FIG. 3. That oversizing allows a limited degree of rotation about male aligning member 30 in aperture 52 and, consequently, allows positioning of pin 36 in a close fit in slot 42. Once pin 36 is inserted in slot 42, defining the primary location of adjacent modular cabinets, however, the adjacent modules are secured against any further such rotation.

To further aid in aligning modular cabinets and to compensate for uneven flooring, a first pair of rollers 48 are mounted on the front bottom of the cabinets, on the same side as first docking channel member 11. A second pair of rollers 46 are mounted on the bottom rear of the cabinets on the same side as second docking channel member 15. Additionally, rotating "screw-down" feet 44 are mounted adjacent rollers 46. The diameters of rollers 48 may be slightly less than the diameters of rollers 46 or the rollers may have the same diameter, but with the mounting plate of the rollers 48 recessed one-eighth inch (⅛") to the inside of the frame.

Therefore, as first male aligning member 30 is inserted into aperture 52 and second male aligning member 28 is inserted into aperture 53, the first pair of rollers 48 are lifted off of the ground. The cabinet may then be moved as pin 28 enters hole 53 until pin 36 mates with slotted aperture 42. Now adjacent cabinets are locked against vertical and lateral movement, but slot 42 will allow for a limited degree of angular movement. It has been found that the provision of the pin 36 and the slot 42 results in approximately a 2:1 or 3:1 improvement of alignment of the paper transport paths in adjacent modular cabinets over the alignment in adjacent cabinets on which the pin 36 and slot 42 are not included. Rotatable feet 44 may thus be turned downward and used to properly align the cabinets to compensate for an uneven floor surface.

To further aid in properly aligning and positioning the cabinets, identical spacers 66 are provided on male positioning members 30 and 28 to provide accurate alignment of the outer surfaces of adjacent channels 11 and 13 and allow space for relative cabinet motion.

Figure 3:
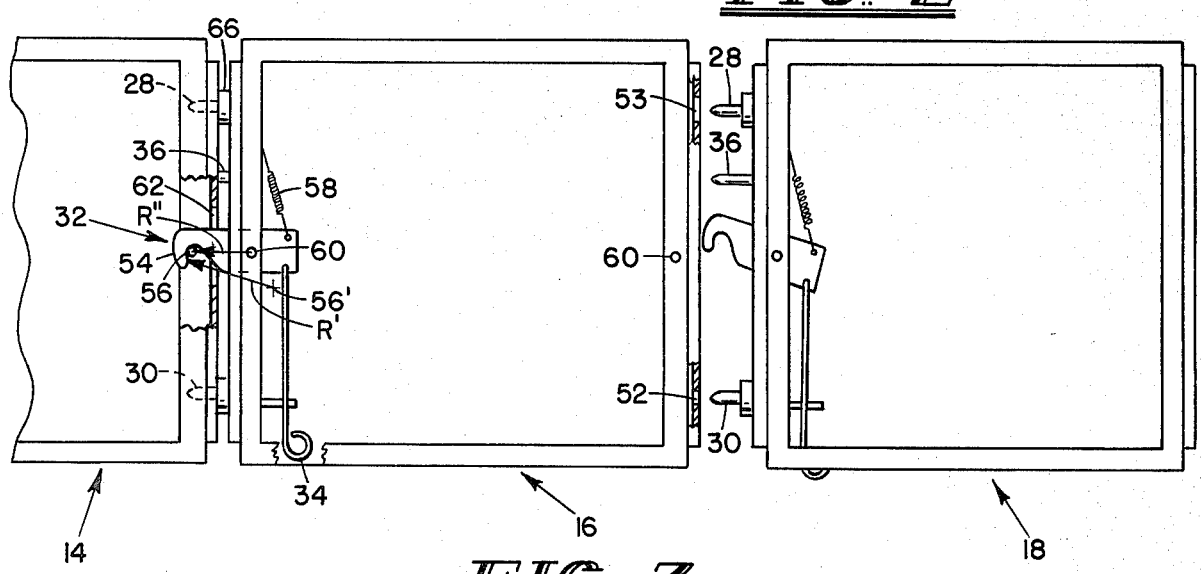
FIG. 3 is a top view of exemplary modular cabinets bearing the docking channels of the present invention.

Referring to FIG. 3, latch means 32 comprises a hook shaped member 54 rotatably mounted about pin 60. Hook shaped member 54 may be spring biased into locking position by a spring 58, and a release rod 34 is provided to rotate the latch into an open position. An important feature of the present invention is to provide hook shaped member 54 with an inner curved surface 56 having a center of rotation which is offset from center point 56' of the radius about which member 54 rotates around pin 60. In the described embodiment the radius R' of curvature of inner curved surface 56 is larger than the radius R" about which the member 54 rotates about the pin 60, although the radius R' may be equal to or less than the radius R", as long as the respective centers of curvature are offset. Vibration or other forces applied in a direction to mate the cabinets will therefore cause the latching members to provide a closing action.

Thus, the connecting and aligning mechanism of the present invention provides a simple, inexpensively constructed, but highly accurate, connecting and aligning mechanism for modular cabinets which is easy to install, remove and operate.

Although the invention has been described in conjunction with the foregoing specific embodiment, many alternatives, variations and modifications will be apparent to those of ordinary skill in the art. Those alternatives, variations and modifications are intended to fall within the spirit and scope of the appended claims.

We claim:

1. A connecting and aligning mechanism for a word processor-controlled printer having output module cabinets with facing adjacent wall members comprising:

first positioning means mounted on a first portion of said facing adjacent wall members of output module cabinets comprising a docking channel member mounted on a first modular cabinet and having laterally spaced first and second male aligning members, and a second docking channel member mounted on a second modular cabinet and having laterally spaced first and second female aligning apertures for mating with said first and second male aligning members for connecting the output module cabinets;

a latching pin mounted in said first docking channel member;

a latching member including a spring biased rotatable hook means mounted in said second docking channel member for engaging said latching pin; and second positioning means mounted on a second portion of said facing adjacent wall members of said output modular cabinets vertically spaced from the first portion comprising a male positioner mounted on said first modular cabinet and a female positioner mounted on said second modular cabinet.

2. A connecting and aligning mechanism as in claim 1 wherein said spring-biased rotatable hook means comprises a contoured curved latching surface for engaging said pin means, said contoured curved latching surface having a center of curvature which is offset from the center of curvature of the arc in which the hook means rotates.

3. A connecting and aligning mechanism as in claim 1 wherein said first and second channel members are formed of identical lengths of channel having an elongated laterally extending slot formed in the center thereof and two pairs of vertically spaced apertures formed in said channel members on both sides of said slot, and a vertically disposed pin member laterally displaced from and perpendicular to the longitudinal axis of said slot whereby said first channel member is formed by securing said first and second male aligning members in a first pair of said two pairs of vertically spaced apertures and rotatably mounting said rotatable hook means about said vertically disposed pin member, and whereby first and second female aligning apertures of said second channel member comprise the second pair of vertically spaced apertures, and said latching pin for mating with said latching member comprises said vertically disposed pin member.

* * * * *